(12) United States Patent
Cheng et al.

(10) Patent No.: US 7,868,361 B2
(45) Date of Patent: Jan. 11, 2011

(54) SEMICONDUCTOR DEVICE WITH BOTH I/O AND CORE COMPONENTS AND METHOD OF FABRICATING SAME

(75) Inventors: Chung Long Cheng, Hsin-chu (TW); Sheng-Chen Chung, Hsin-Chu (TW); Kong-Beng Thei, Hsin-Chu (TW); Harry Chuang, Austin, TX (US); Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 224 days.

(21) Appl. No.: 11/766,425

(22) Filed: Jun. 21, 2007

(65) Prior Publication Data

US 2008/0315320 A1  Dec. 25, 2008

(51) Int. Cl.
*H01L 21/76* (2006.01)
(52) U.S. Cl. .................. 257/217; 257/379; 257/350; 257/E21.549; 438/424; 438/438
(58) Field of Classification Search ............. 257/217, 257/379, 350, E21.549; 438/424, 438
See application file for complete search history.

(56) References Cited

U.S. PATENT DOCUMENTS 7,572,712 B2 *  8/2009  Chong et al. ............... 438/424
2004/0245577 A1 *  12/2004  Bhattacharyya ............. 257/369
2005/0116360 A1 *  6/2005  Huang et al. ................ 257/900
2005/0260807 A1 *  11/2005  Orlowski et al. ............ 438/197
2006/0148153 A1 *  7/2006  Kwon et al. ................. 438/197
2006/0258123 A1 *  11/2006  Forbes ........................ 438/474
2007/0145487 A1 *  6/2007  Kavalieros et al. .......... 257/368
2008/0124878 A1 *  5/2008  Cook et al. .................. 438/300

* cited by examiner

*Primary Examiner*—Zandra Smith
*Assistant Examiner*—Telly D Green
(74) *Attorney, Agent, or Firm*—Slater & Matsil, L.L.P.

(57) ABSTRACT

A semiconductor device having a core device with a high-k gate dielectric and an I/O device with a silicon dioxide or other non-high-k gate dielectric, and a method of fabricating such a device. A core well and an I/O well are created in a semiconductor substrate and separated by an isolation structure. An I/O device is formed over the I/O well and has a silicon dioxide or a low-k gate dielectric. A resistor may be formed on an isolation structure adjacent to the core well. A core-well device such as a transistor is formed over the core well, and has a high-k gate dielectric. In some embodiments, a p-type I/O well and an n-type I/O well are created. In a preferred embodiment, the I/O device or devices are formed prior to forming the core device and protected with a sacrificial layer until the core device is fabricated.

14 Claims, 13 Drawing Sheets

(SH 1 OF 3)

(SH 2 OF 3)

(SH 3 OF 3)

US 7,868,361 B2

SEMICONDUCTOR DEVICE WITH BOTH I/O AND CORE COMPONENTS AND METHOD OF FABRICATING SAME

TECHNICAL FIELD

The present invention relates generally to the field of fabricating semiconductor devices, and relates more particularly to the fabrication of a reliable semiconductor device that included an I/O (input/output) device and a core device, and a method for fabricating such a device.

BACKGROUND

Generally, semiconductor devices are very small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are extremely small.

There are many kinds of semiconductor components. Transistors, for example, are small switches that may be used to manipulate electrical signals. Diodes perform a similar though not identical function. Resistors and capacitors may also be formed as semiconductor devices. Over a million of such components may be formed on a single chip, and connected together to form the integrated circuits.

These semiconductor devices are fabricated on the wafer substrate using a sequence of operations. Generally speaking, ion implantation is used to impart semiconductor characteristics to the substrate or to structures formed on it. Layers of insulating and conducting material are then selectively added and removed to create the parts of each individual component. One common fabrication technique, for example, is called photolithography. In photolithography, a material called photoresist is formed on top of one or more layers of underlying material. The photoresist is then selectively exposed to light through a screen known as a mask. The exposed portions will possess different physical properties than the unexposed portions and, depending on the type of photoresist used, one of them may be removed by a selected solvent, leaving a set of protective structures.

Once the protective structures are in place, the unprotected portions of the underlying layers can be reduced or removed completely, for example by etching. They may also be subjected to treatments such as ion implantation. In any case, once the selective treatment or removal has been accomplished, the remaining photoresist structures may be removed without harming the underlying materials by a solvent selected for this purpose. An exemplary transistor will now be described as background to the present disclosure.

FIG. 1 is a side (elevation) view illustrating in cross-section a typical semiconductor device 10. Semiconductor device 10 is a transistor, which includes a gate structure 12 that has been formed on a substrate 20. Gate structure 12 includes a gate electrode 14 that is separated from the substrate 20 by a gate oxide 13. Gate electrode 14 may be made, for example, of a metal or a crystalline polysilicon ("poly"). The gate oxide 13 may simply be a portion of a silicon substrate 20 that has been encouraged to oxidize. A metal contact 15 may be used in the case of a poly gate to provide a reliable area for terminating external electrical conductors (not shown). A spacer may be positioned on either side of the gate electrode 14, and in this example spacer 16 and spacer 17 serve this function. A source region 21 and a drain region 23 are formed in the substrate 20, typically by ion implantation, and define a channel 22 between them and beneath gate structure 12. In operation, a current may be made to flow through channel 22 when a certain voltage is applied to the gate electrode 14.

At times, semiconductor devices such as the transistor of FIG. 1 may be used for different but complementary functions. One example is where two transistors are used, one as a core device and one as an I/O (input/output) device. FIG. 2 is a side view illustrating in cross-section a typical semiconductor device 30 of this kind. In semiconductor device 30, a core well 18 and an I/O well 19 have been formed adjacent each other, and are separated by STI (shallow trench isolation) structure 26 (also visible in FIG. 1). Core well 18 and I/O well 19 have been formed separately in substrate 20 by separate ion implantations in such a way as to give each its desired properties. The transistor of FIG. 1 is formed, in semiconductor device 30, on core well 18.

A second transistor, I/O device 40, has been formed on I/O well 19. I/O device 40 has a gate structure 45 that includes a gate electrode 34, which is separated from I/O well 19 by a gate dielectric 33. Contact 35 is disposed directly on gate electrode 34. Side spacers 36 and 37 are disposed on either side of gate structure 45. Source region 41 and drain region 43 define channel 42 in the I/O well 19 portion of substrate 20, under gate structure 45.

As should be apparent, the component parts of semiconductor device 10 and I/O device 40 are similar. There are differences, however, that affect the fabrication of such devices on the same wafer. The core device in some applications performs better when it has a thinner gate oxide than benefits the I/O device. The I/O device, on the other hand, may have to handle a higher voltage, however, so it cannot always be fabricated to the specifications best suited for the core device.

Needed, then, is a way to fabricate reliable semiconductor devices in an efficient manner despite their different performance criteria. The present invention provides just such a solution.

SUMMARY OF THE INVENTION

These and other problems are generally solved or circumvented, and technical advantages are generally achieved, by preferred embodiments of the present invention, which is directed to a semiconductor device having a core component and an I/O (input/output) component, and to a method for fabricating such a device.

In one aspect, the present invention is a semiconductor device including a core device that has a high-k gate dielectric disposed over a strained-silicon channel region and an I/O (input/output) device, wherein the I/O device does not include a high-k gate dielectric. The high-k gate dielectric preferably has a dielectric constant greater than about 8. The components are, for example MOSFETs (metal oxide semiconductor field effect transistors), though they may have either metal, poly (polycrystalline silicon), or silicide gate electrodes. The semiconductor device may further include a resistor. The strained-silicon channel region in a preferred embodiment is formed by in-situ epitaxial growth of silicon over silicon-germanium in a recess adjacent the core device gate structure.

According to another aspect, the present invention is a semiconductor device including a first component having a high-k gate dielectric and being disposed over a strained-silicon channel region including silicon germanium, the device also having a second component that does not include a high-k dielectric. The first component of this semiconductor device may, for example, be a transistor having a source region and a drain region, where the source region and the drain region each having an upper boundary that extends above the high-k gate dielectric. The first component may also include a metal gate electrode disposed over the high-k gate dielectric. The second component of this semiconductor device may include, for example, a silicon dioxide gate dielectric.

In yet another aspect, the present invention is a method including the operations of forming at least one isolation structure in a substrate, forming a core well and an I/O well separated by the at least one isolation structure, forming a oxide layer on the I/O well, forming a poly layer on the I/O well oxide layer, forming an I/O device gate structure from the poly layer and the oxide layer, forming an LDD in the I/O well, forming dummy spacers to protect the I/O device, defining a core device channel, adjusting the $V_t$ (threshold voltage) of the core device channel by ion implantation, performing an RTA, forming a core device high-k gate dielectric, forming a core device gate electrode, forming a core device source region and a core device drain region, removing the dummy spacers, forming spacers for the core device and the I/O device, and forming the source regions and the drain regions by ion implantation.

According to another aspect, the present invention is a method of fabricating a semiconductor device including forming a core well and an I/O well in a substrate, the core well and the I/O well separated by an isolation structure. An ion implantation may, in some cases, be performed into the core well for $V_t$ (threshold voltage) adjustment. The method according to this aspect also includes forming an I/O-device gate structure on the I/O well; the I/O-device gate structure comprising an electrode disposed above a dielectric, the I/O device dielectric, for example, is formed of silicon dioxide and has a dielectric constant of less than about 5. This method may also include forming a strained-silicon channel in the core well, and forming a core-device gate structure on the core well, the core-device gate structure includes an electrode disposed above a dielectric, the core-device dielectric having a dielectric constant of greater than about 8. In one embodiment, forming the strained-silicon channel includes forming a channel recess in the core well, forming a silicon-germanium layer in the channel recess by epitaxial growth, and forming a silicon layer by epitaxial growth.

This method may also include performing an LDD ion implantation into the I/O well, and annealing the semiconductor device subsequent to the LDD ion implantation. For example, where the semiconductor device comprises an n-type I/O well and a p-type I/O well, the LDD ion implantation comprises a p-type LDD ion implantation and an n-type LDD ion implantation. After I/O poly gate and poly resistors were defined, a dummy spacer to separate the I/O device and the core device with high-k device process. The dummy spacer may be removed later. This method may also include forming a resistor disposed on an isolation structure adjacent to the core well, and forming a nitride layer over the I/O-device gate structure and the resister prior to forming the strained-silicon channel for the core device. The method may also include forming a strained-silicon source region and a strained-silicon drain region for the core device, for example by forming source and drain region recesses in the core well adjacent the core-device gate structure, forming a silicon-germanium layer in the source region recess and in the drain region recess by epitaxial growth, and forming a silicon-carbon layer over the silicon-germanium layers by epitaxial growth.

In yet another aspect, the present invention is a method of fabricating a semiconductor device on a substrate including providing a semiconductor substrate, forming at least one isolation structure in the substrate, forming a core well and an I/O well separated by the at least one isolation structure, forming a oxide layer on the I/O well, forming a poly layer on the I/O well oxide layer, forming an I/O device gate structure from the poly layer and the oxide layer, forming an LDD in the I/O well, forming dummy spacers to protect the I/O device, defining a core device channel, adjusting the $V_t$ of the core device channel by ion implantation, performing an RTA, forming a core device high-k gate dielectric, forming a core device gate electrode, forming a core device source region and a core device drain region, removing the dummy spacers, forming spacers for the core device and the I/O device, and forming the source regions and the drain regions by ion implantation.

Advantages of the present invention include an I/O device that retains desirable properties without the need to alter the high-k process used in forming the core device; the I/O device may be formed without a high-k dielectric layer while the core device may use a high-k dielectric with either a poly or a metal gate. In preferred embodiments of the present invention, an addition mask for I/O device integration is unnecessary and ion implantation through oxide for the I/O device may be avoided.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having a resistor, and having a core device and an I/O device that are both MOS (metal oxide semiconductor) transistors. The invention may also be applied, however, to other semiconductor devices as well.

Figure 1:
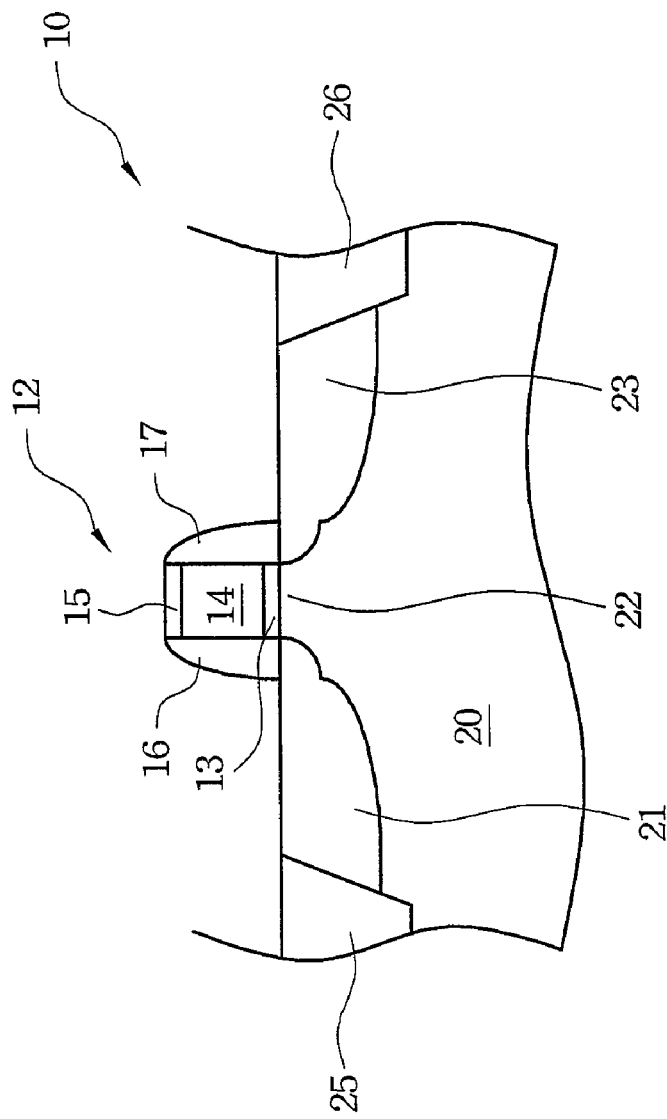
FIG. 1 is a side (elevation) view illustrating in cross-section a typical transistor.
Figure 2:
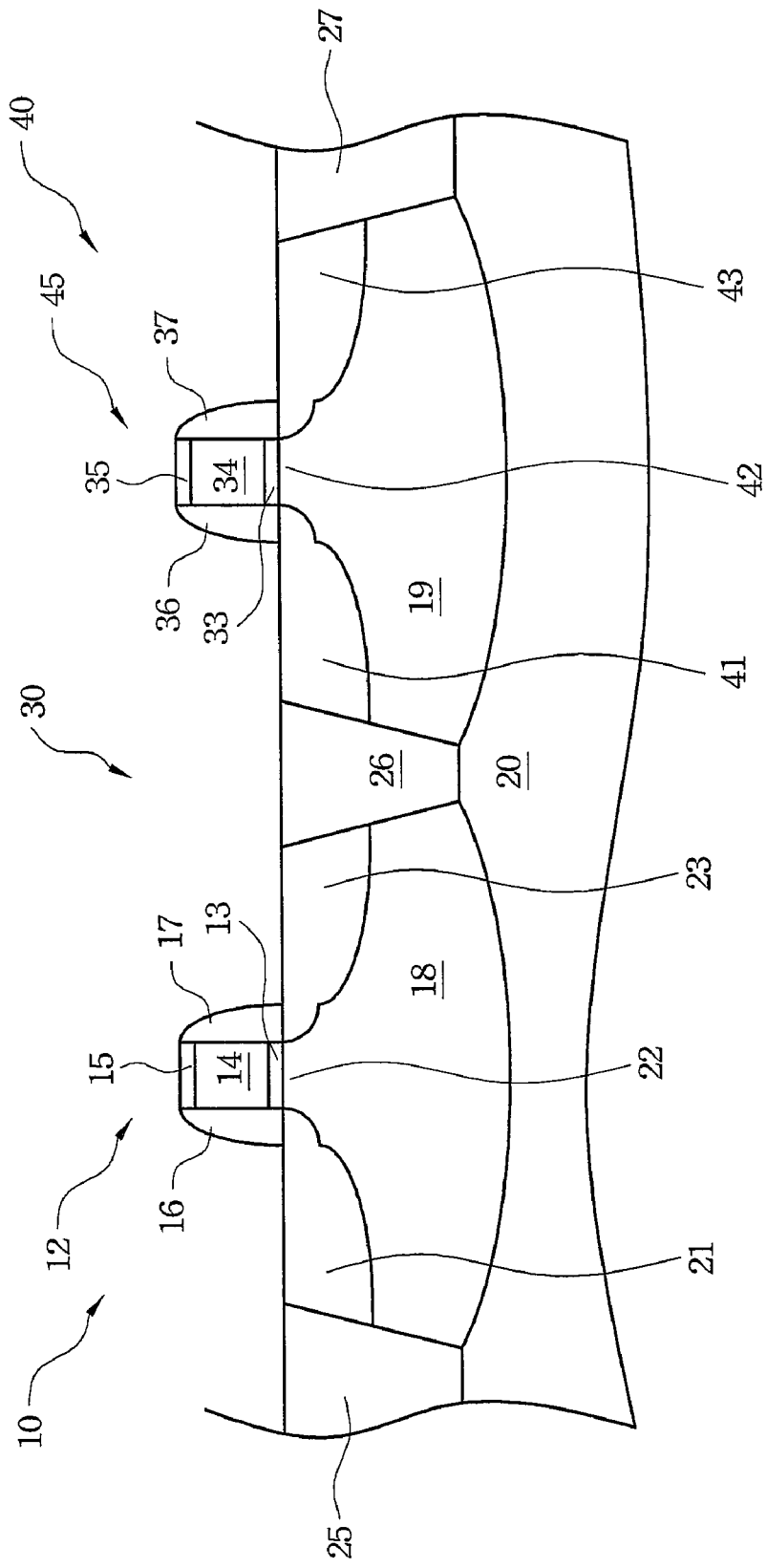
FIG. 2 is a side view illustrating in cross-section a typical semiconductor device.
Figure 3:
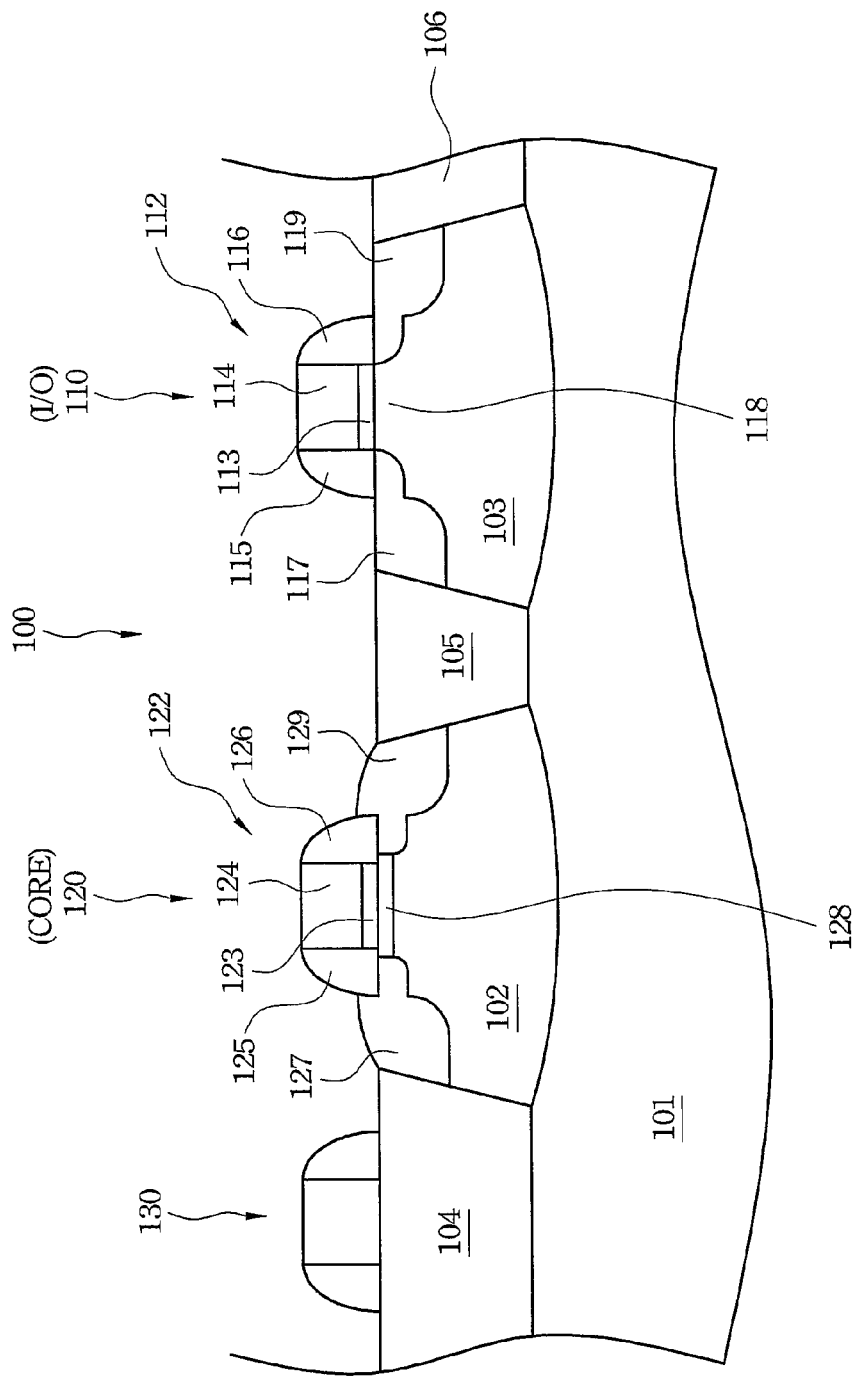
FIG. 3 is a side view illustrating in cross-section a semiconductor device according to an embodiment of the present invention.

FIG. 3 is a side view illustrating in cross-section a semiconductor device 100 according to an embodiment of the present invention. Semiconductor device 100 includes a substrate 101 having a core well 102 and an I/O well 103 separated by an isolation structure 105. Each of the wells is also bounded by a respective isolation structure 104 and 106 to isolate it from adjacent portions of the device (not shown). An I/O device 110 is formed on the I/O well 103, and includes a gate structure 112. The gate structure 112 includes a gate electrode 114, for example of poly, separated from the substrate by a gate oxide 113. The gate oxide 113 is preferably silicon dioxide formed by oxidation of the substrate surface, and has a dielectric constant of about 4. Spacers 115 and 116 are positioned of either side of the gate structure 112. A source region 117 and a drain region 119 are formed in the substrate on either of the gate structure 112, defining a channel 118.

In the embodiment of FIG. 3, a core device 120 is formed on the core well 102. The core device 120 includes a gate structure 122. A source region 127 and a drain region 129 are formed in the substrate on either side of the gate structure. In one preferred embodiment, the source region and the drain region both exhibit a raised profile, as shown in FIG. 3. That is, the upper boundary of the source region 127 and the upper boundary of the drain region 129 are both higher at some point than the lower boundary of the gate structure. In addition, in a preferred embodiment, the source region 127 and the drain region 129 comprise a silicon-germanium portion and a silicon-carbon portion (not separately shown in FIG. 3), formed for example by filling a recess in the substrate by epitaxial growth. Similarly, channel 128 between source region 127 and drain region 129 includes a (strained) silicon layer disposed on a silicon-germanium layer.

The gate structure 122 includes a gate electrode 124 separated from the core well 102 of substrate 101 by a gate dielectric 123. According to the present invention the gate dielectric 123 is formed of a high-k material, that is, it has a dielectric constant greater than 8, and preferably in the range of about 8 to 40. The gate electrode 124 may be formed either of metal or of poly or of a combination of the two. Spacers 125 and 126 are positioned on either side of the gate structure 122. In the embodiment of FIG. 3, semiconductor device 100 also includes a resistor 130 formed on the isolation structure 104 adjacent the core well 102.

Figure 4:
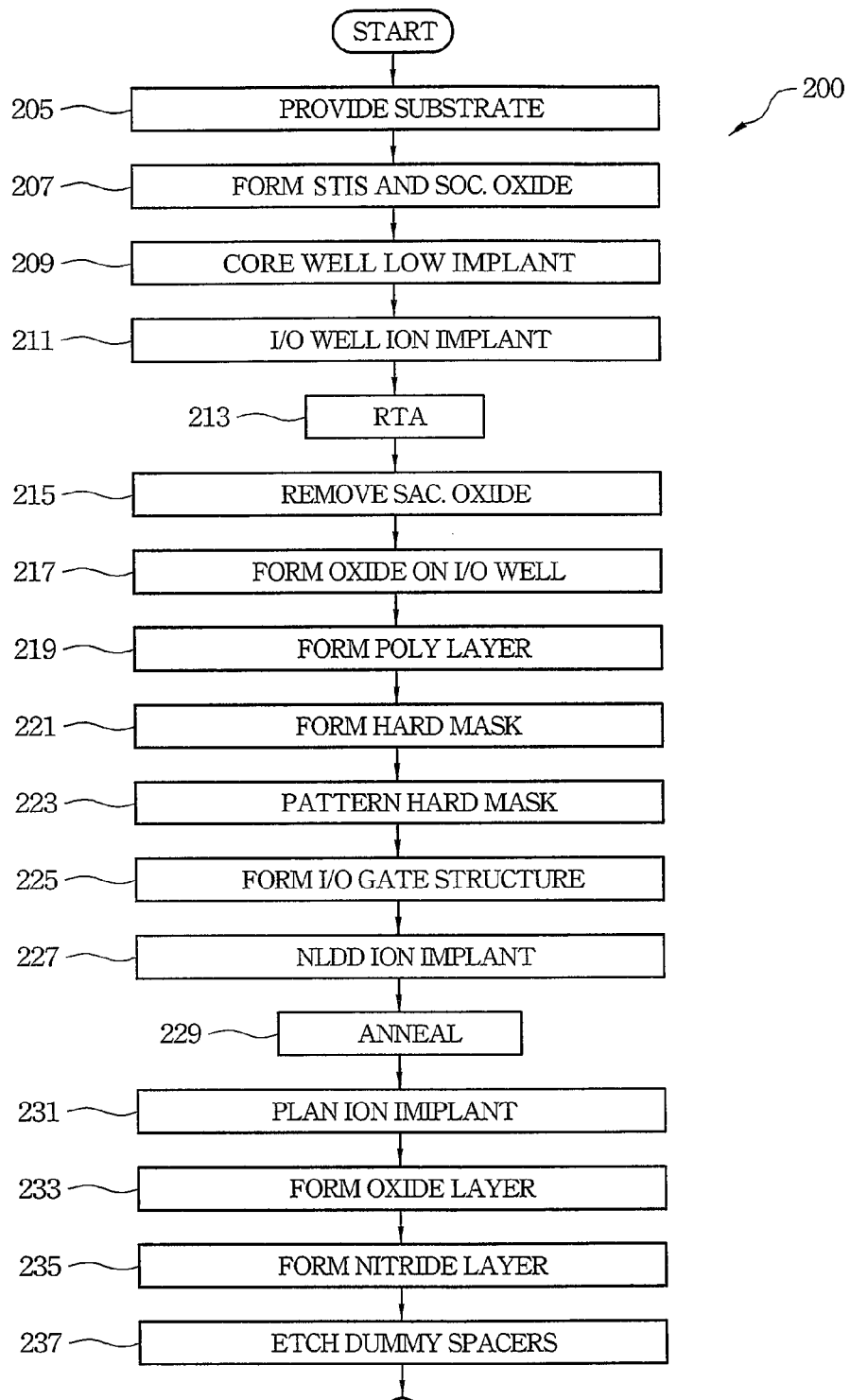
FIG. 4 is a flow diagram illustrating a method according to an embodiment of the present invention.
Figure 4:
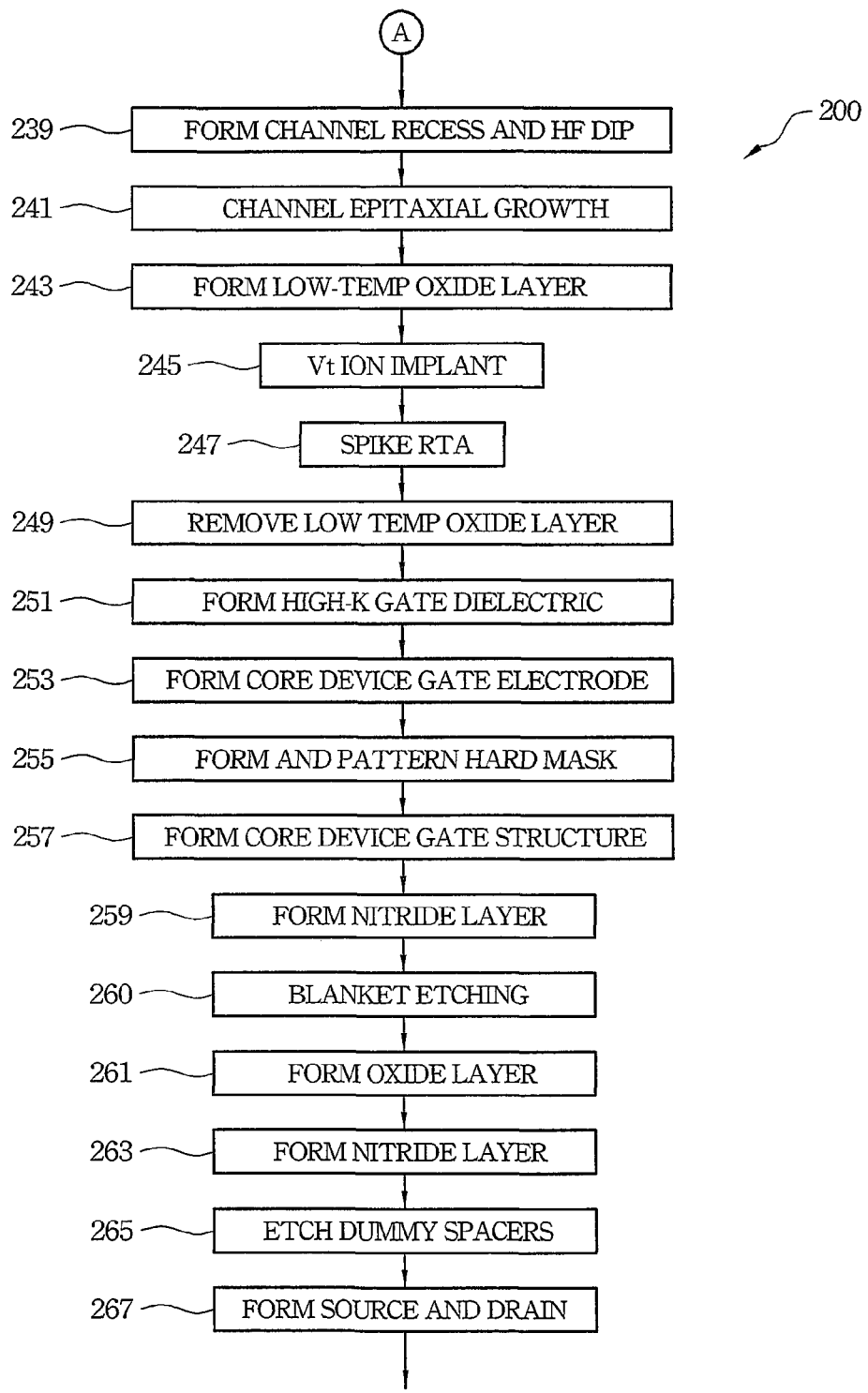
Figure 4:
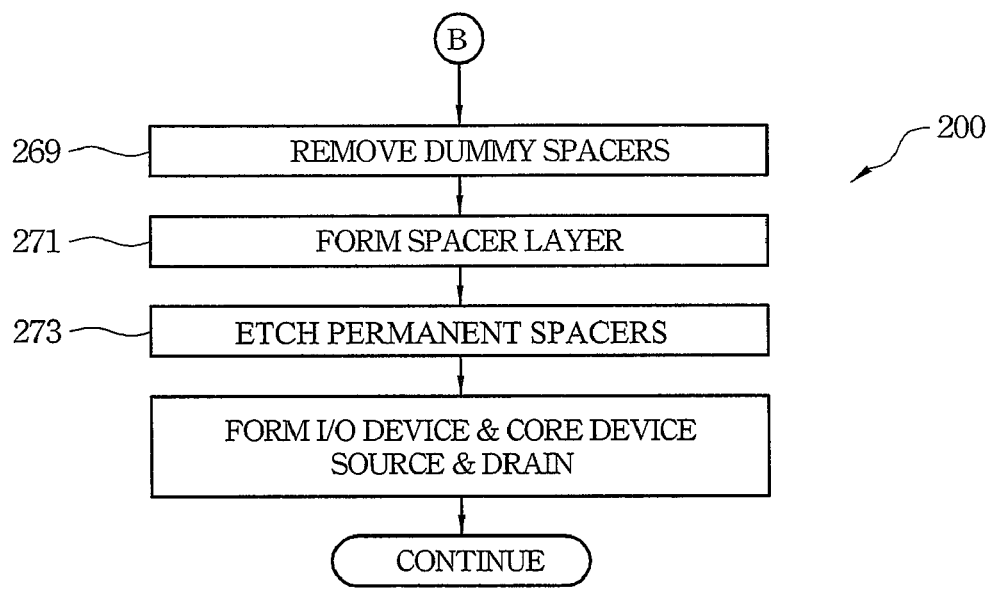

One process for fabricating a semiconductor device will now be described. FIG. 4 is a flow diagram illustrating a method 200 of fabricating a semiconductor device according to an embodiment of the present invention. At START, it is presumed that the equipment and materials required for performance of the method are operational and available. The method then begins with providing a substrate (step 205). The substrate may be made of silicon or some other suitable material, and in a presently preferred embodiment the substrate is a silicon wafer. As the semiconductor device of the present invention includes more than one component, one or more STI (shallow trench isolation) structures are then formed (step 207) in the substrate.

The STIs formed in step 207 in effect divide the substrate into separate areas, or wells. A sacrificial oxide layer is also formed along with the STIs. An ion implantation is then performed (step 209) to impart to a well that underlies a core device, and another ion implantation (step 211) to form a well that underlies an I/O device. An RTA (rapid thermal anneal) is then performed (step 213), for example at about 980-1100° C. for about 0-30 seconds. The sacrificial oxide layer formed during the STI process (or, alternately, in a separate operation) is then removed (step 215).

An oxide layer is then formed on the I/O well (step 217), preferably by a growth process. This oxide is intended to form the gate oxide for the I/O device. It may also form on the core-device well, but, if so, this portion of the oxide layer will be removed. A poly layer is then formed (step 219), and a hard mask layer is formed over the poly layer (step 221). This hard mask may be a single layer, but preferably includes an oxide layer underlying a silicon nitride layer. The hard mask is then patterned (step 223), for example using a photolithography process. The hard mask protects a portion of the poly layer disposed above the I/O well so that a poly structure for an I/O device may next be formed (step 225), for example using an etching process.

Ion implantation for the LDD (lightly-doped drain) portion or portions of the I/O device may then be performed. In one embodiment, an NLDD ion implantation (step 227) is performed to create shallow source and drain extensions for NMOS devices, for example at an energy of about 5-80 KeV, followed by an anneal process (step 229). The anneal may, for example, be at 600° C.-900° C. for a duration ranging from 20 to 120 minutes. A PLDD ion implantation (step 231) may then be performed to create shallow source and drain extensions for PMOS devices, for example of an energy of about 5-80 KeV. Naturally, those portions of the semiconductor device that are not to be doped in these steps must be protected, though the formation and removal of the various protection protective regions is not shown separately here.

An oxide layer is then deposited (step 233) over the entire device, followed by a nitride layer (step 235). The nitride layer is then etched (step 237) so as to leave dummy (sacrificial) spacers on either side and on top of the I/O component.

In this embodiment, a recess is then formed in the core well, and an HF dip performed (step 239). Again, the necessary steps to protect non-involved area of each process step are assumed and not here separately shown. An in-situ epitaxial growth process (step 241) is then performed to define, that is to grow in the recess just formed a channel region having a silicon-germanium portion covered by a silicon portion. This creates a strained-silicon channel region for the core device. A low-temperature oxide layer is then formed (step 243) and a selective ion implantation is performed (step 245) to adjust the $V_t$ (threshold voltage) of the core component. A spike RTA (rapid thermal anneal) may then be performed as well (step 247) at, for example, about 980-102° C. The low-temperature oxide layer is then removed (step 249).

In the embodiment of FIG. 4, a high-k gate dielectric layer may then be formed for the core device (step 251), followed by forming a layer of the gate electrode material (step 253). A hard mask is then formed and patterned (step 255), followed by an etching step to define the core device gate structure (step 257). A thin layer is then formed (step 259), either out of a nitride only or out of oxide and nitride films. A blanket etching (step 260) may then be performed to form protective spacers for the core device gate area. In the embodiment of FIG. 4, this is followed by formation of a thin oxide layer (step 261). A nitride layer is then formed (step 263) over the core component and etched (step 265) to form dummy, or sacrificial spacers. The source and drain regions for the core component are then formed (step 267), for example by etching a recess on either side of the core component gate structure and then depositing a layer of silicon-germanium followed by a layer of silicon-carbon (steps not separately shown).

Once the core-component source and drain regions have been created, the dummy nitride spacers are removed (step 269) from both the core component and the I/O component.

The permanent spacer material is then deposited (step 271) and etched (step 273) to form the permanent spacers. Note that the permanent spacers may include more than one layer of material, even though multiple layers are not separately shown here. Finally, ion implantation for the source regions and drain regions of the I/O and core device are performed (step 275), which of course may involve several individual steps (not separately shown). The process then continues with additional device fabrication steps, and ultimately with packaging and installing the final semiconductor device.

It is noted that the method 200 described above is only one embodiment of the present invention, and many variations are possible. In other embodiments, certain of the operations recited above may be omitted, and others added. In addition, the sequence set forth here may be varied, and the operations described may be performed in any logically-consistent order unless a specific order is recited or apparent from the context.

Another embodiment of the present invention will now be described FIGS. 5a through 5g are a sequence of side views illustrating in cross-section the configuration of a semiconductor device 300 at various selected stages of fabrication. In this embodiment, a wafer substrate 301 is provided, preferable of silicon or some other suitable material. As should be apparent, semiconductor 300 device occupies only a small portion of the substrate; in a typical application there would be many more such devices being fabricated at the same time. A number of isolation structures are formed in the substrate, and isolation structures 304, 305, and 306 are visible in FIG. 5a.

Using selective ion implantation, a core well 302 and an I/O well 303 are created, separated in this case by isolation structure. Note that these features are similar or identical to certain features shown in FIG. 3. Where practicable, similar or identical features will be numbered analogously in FIGS. 5a though 5g. This does not imply, however, that there are no differences between analogously numbered features. And as with FIG. 3, the features of FIGS. 5a through 5g are not necessarily drawn to scale. An RTA may be performed at this time, and any sacrificial oxide layer (not shown) in place during ion implantation may be removed.

Figure 5A:
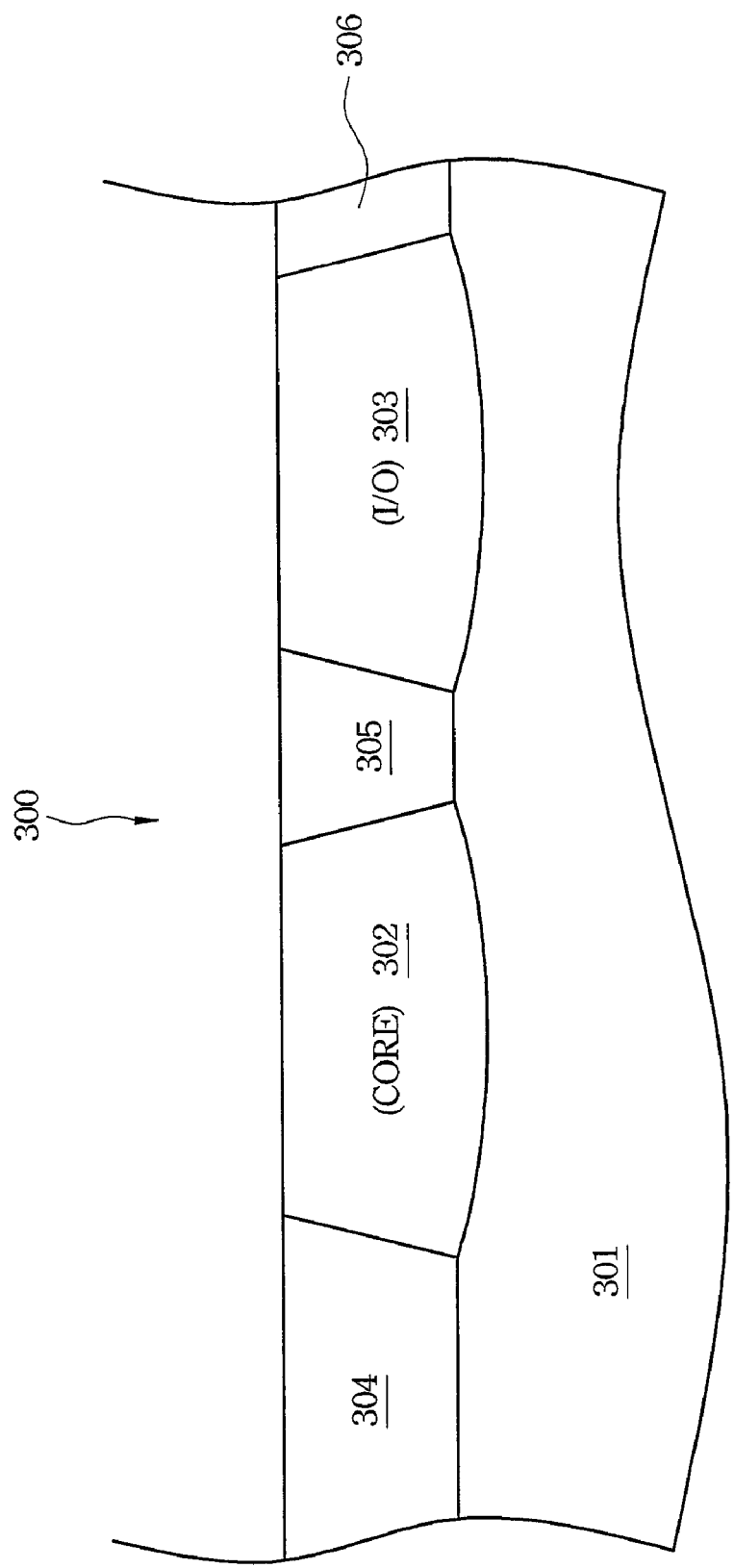
FIGS. 5a through 5g are a sequence of side views illustrating in cross-section the configuration of a semiconductor device at various selected stages of fabrication.
Figure 5B:
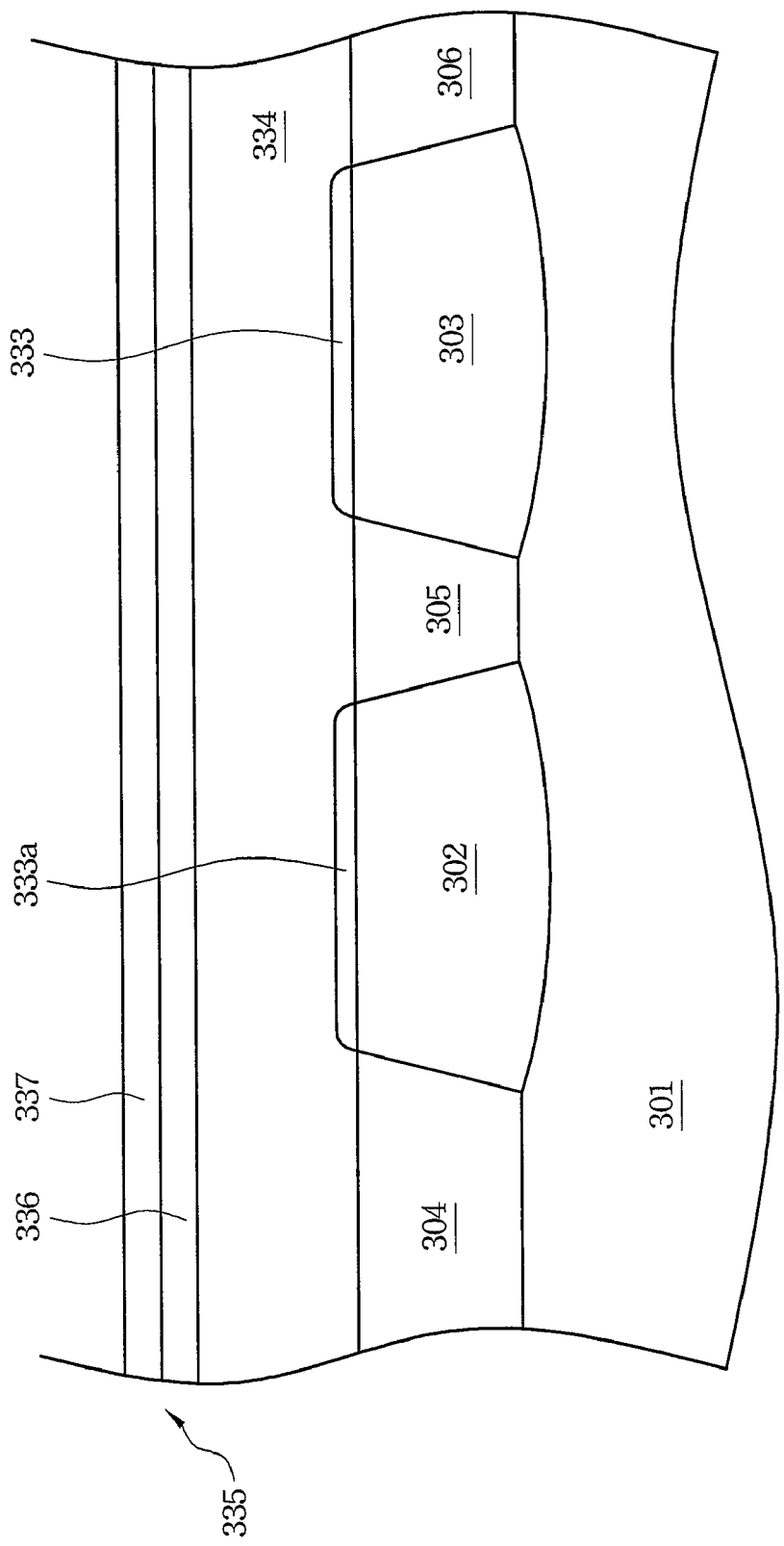
Figure 5C:
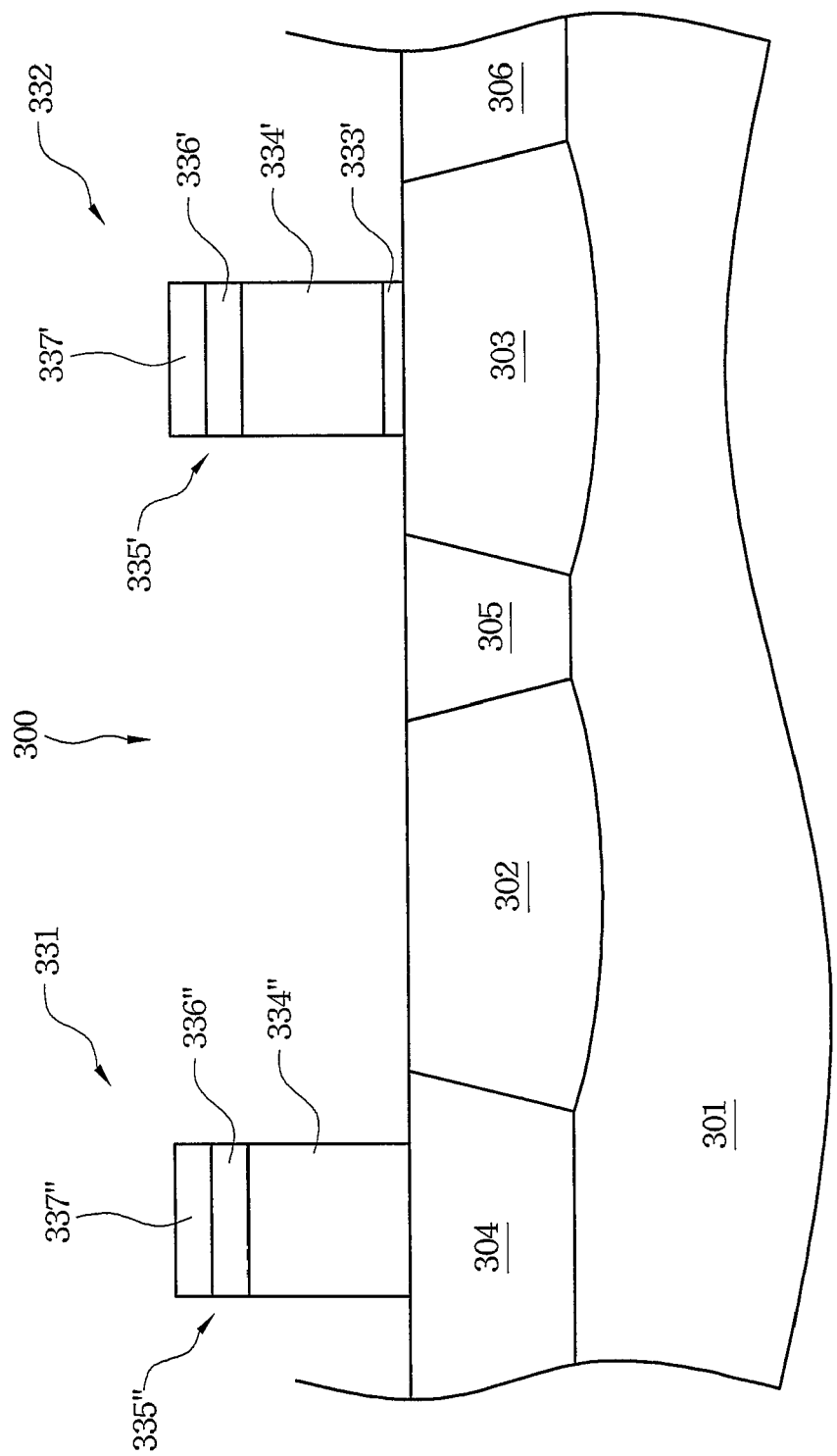

In this embodiment, gate stack layers may now be formed. An oxide layer 333 is grown on the I/O well. Such a layer (numbered 333a) may also be seen in FIG. 5b on the core well, although it will be later removed. A poly layer 334 is formed over the oxide layers, and a hard mask layer 335 is formed over the poly layer. In this embodiment, the hard mask layer 335 includes an oxide layer 336 and a nitride layer 337. In other embodiments (not shown), the hard mask layer may consist one or more than two layers. The hard mask layer 335 is then patterned, and used to form a gate stack 332 on the I/O well, including oxide portion 333', poly portion 334', and hard mask 335'. In this embodiment, a stack 331 is also disposed on the isolation structure for the purpose of forming a resistor. Resistor stack at this point includes a poly portion 334" and a hard mask portion 335" consisting of oxide layer 336" and nitride layer 337". The oxide layer previously formed over the core well may be removed at this time, that is, at the same time that the gate stack 332 on the I/O well 303 is formed. The gate stacks for the I/O device and the resistor are shown in FIG. 5c.

In this embodiment, an LDD implant is now performed for the I/O device. As should be apparent, when the LDD implantation is performed for the I/O device, the core well and other non-I/O portions of the device may be protected, for example with photoresist structures. Note that although only one core device and one I/O device are shown, there may be both PMOS and NMOS devices formed on the wafer. In that case both an NLDD implantation and a PLDD implantation are performed in sequence. An anneal process may then be performed, for example at about 600-900° C. for about 20-120 minutes.

Figure 5D:
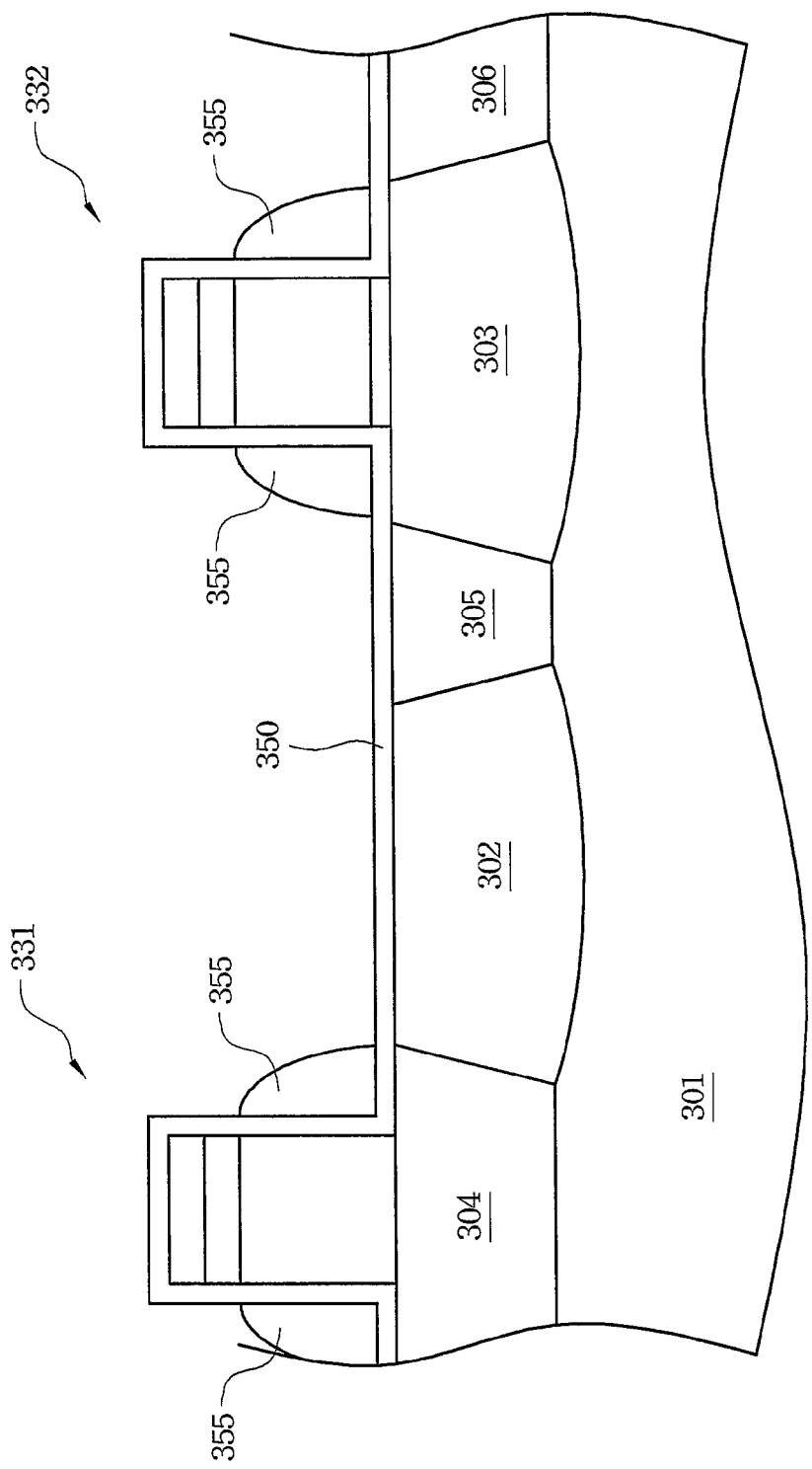
Figure 5E:
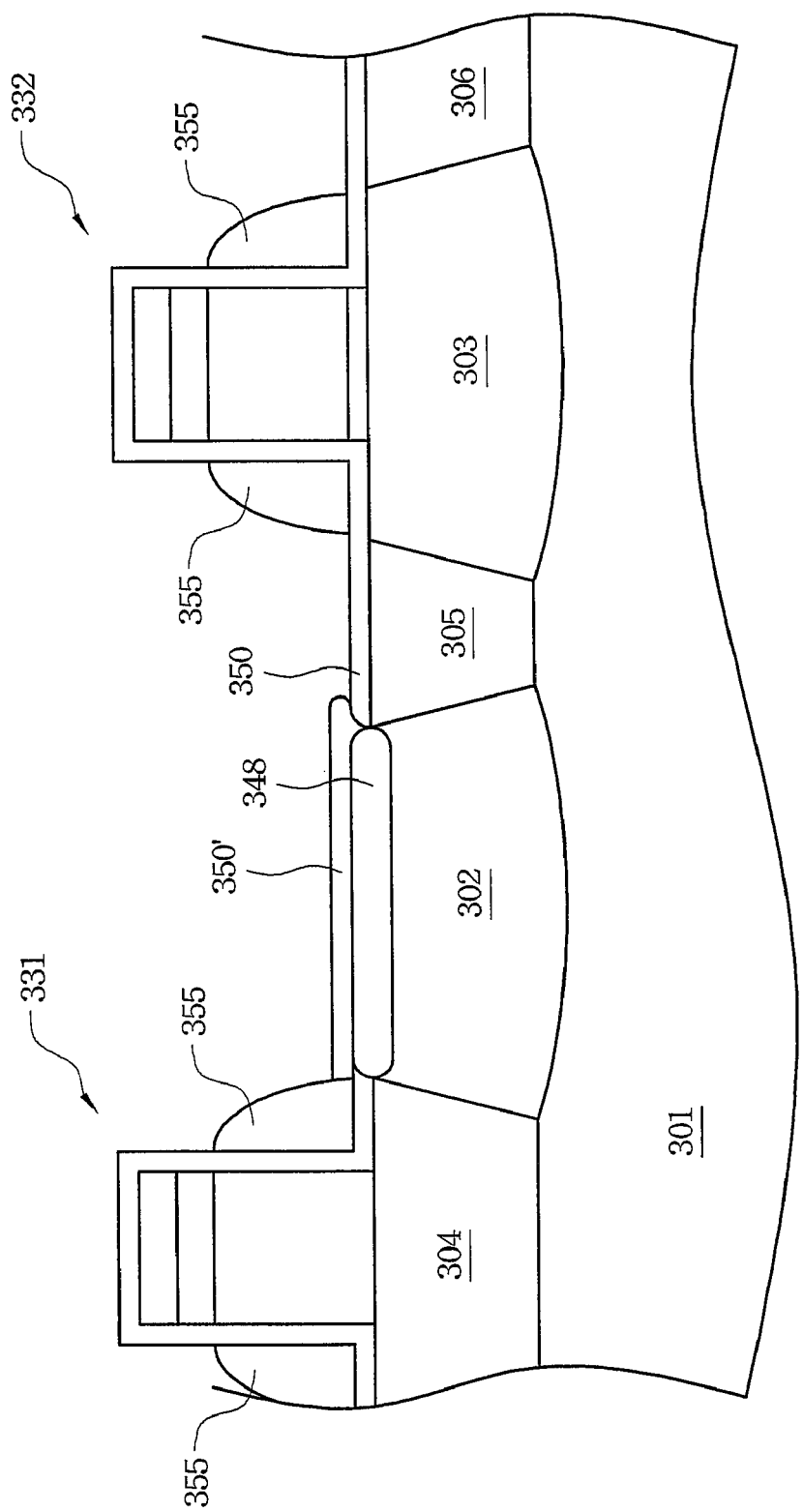
Figure 5F:
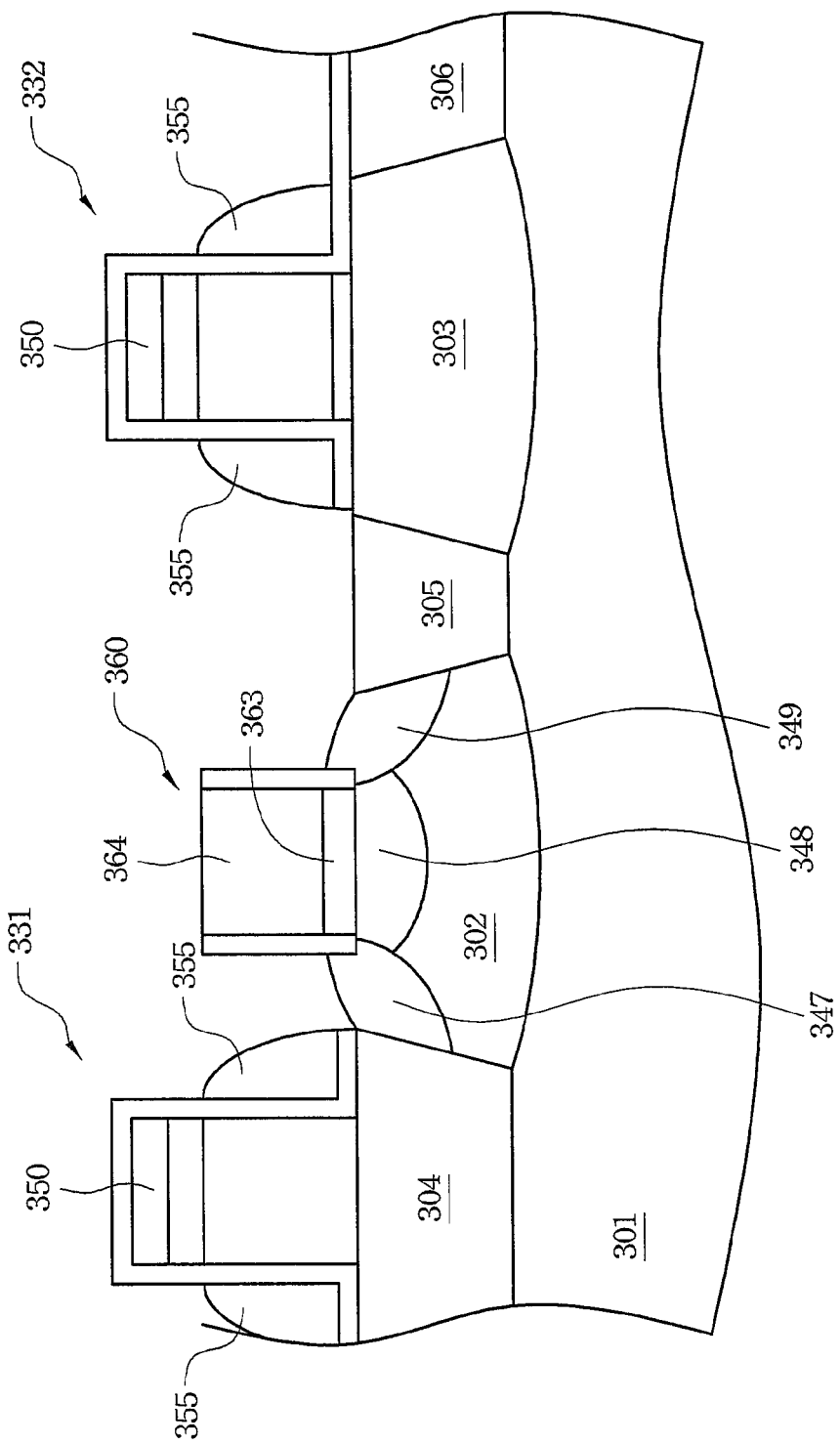
Figure 5G:
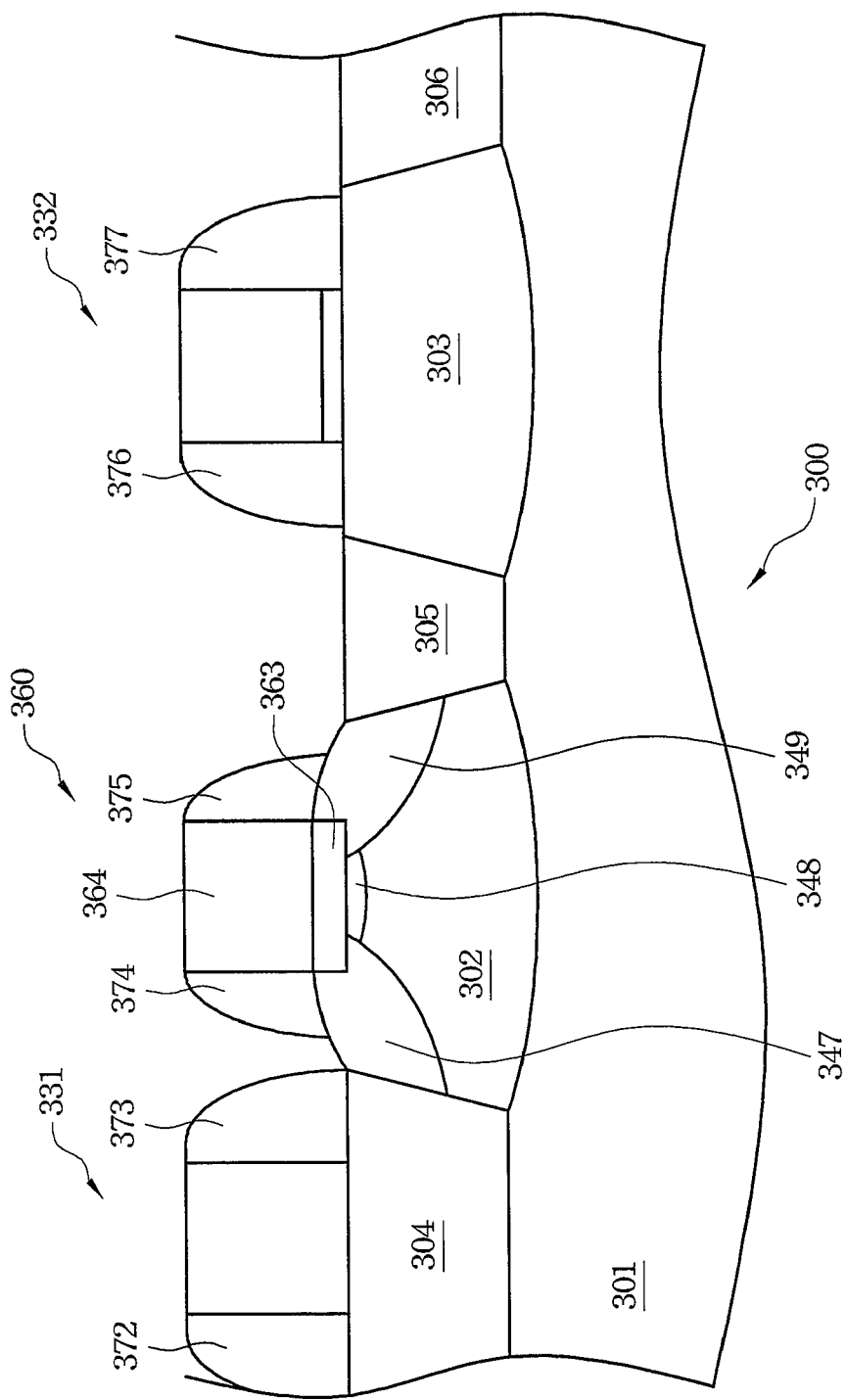

In the embodiment of FIGS. 5a through 5g, a nitride layer 355 is then formed and etched to create sacrificial spacers, for example of silicon nitride, for the existing structures. As shown in FIG. 5d, an oxide layer 350 may be formed prior to forming the nitride layer. With this protection in place, the core device channel may now be defined. A recess is etched in the core well, the other relevant area now being protected, and an HF (hydrofluoric acid) dip is used to remove any residual material. The core device channel region may then be formed in the recess by epitaxial growth, first of silicon-germanium, then of silicon, producing a strained silicon channel 348. A low temperature oxide layer 353' may then be deposited over the newly formed channel, as shown in FIG. 5e. An ion implantation of the core region for adjustment of the threshold voltage may then be performed, followed in this embodiment by a spike RTA In this embodiment, the exposed portions of oxide layer 350 and 350' are removed and a core device gate structure 360 is fabricated. A high-k gate dielectric 363 is formed and separates a gate electrode from the channel 348, for example. The gate dielectric may, for example, be made of, for example, HfO, HfON, SiON, which have dielectric constants in the preferred range of about 8-40. The gate electrode 364 may be formed of poly or of a metal. A source region 347 and a drain region 349 are also formed, as shown in FIG. 5f. In the embodiment of FIGS. 5a through 5g, the source region 347 and the drain region 349 are formed by first forming a recess, then using epitaxial growth of silicon-germanium followed by silicon-carbon. The source region and the drain region both exhibit a raised profile, meaning that at least at some point along their upper boundary they are higher than the lower boundary of the gate structure. Finally, the remaining dummy spacers and oxide layers are removed, and permanent spacers 372 through 377 are formed, resulting in the configuration shown in FIG. 5g.

Although the present invention and its advantages have been described in detail, it should be understood that various changes, substitutions and alterations can be made herein without departing from the spirit and scope of the invention as defined by the appended claims. For example, a different sequence of operations may be used, in some cases, and other materials may be substituted for those recited above.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a core device comprising a high-k gate dielectric disposed over a strained-silicon channel region, wherein the strained-silicon channel region comprises a silicon layer disposed on a silicon germanium layer, the silicon germanium layer disposed between the silicon layer and a substrate, the silicon layer and the silicon germanium layer not extending into source/drain regions of the core device; and an I/O (input/output) device, wherein the I/O device does not include a high-k gate dielectric.

2. The semiconductor device of claim 1, wherein the high-k gate dielectric has a dielectric constant greater than about 8.

3. The semiconductor device of claim 1, further comprising a resistor.

4. The semiconductor device of claim 1, wherein the source/drain regions of the core device comprise an epitaxial layer disposed in a recess of the substrate, wherein at least a portion of a top surface of the source/drain regions is above a top surface of the strained-silicon channel region of the core device.

5. A semiconductor device, comprising:
a first component disposed in a substrate and comprising a high-k gate dielectric disposed over a strained-silicon channel region, wherein the strained-silicon channel region comprises a multi-layer stack filling a recess disposed within the substrate, the recess not extending into source/drain regions of the first component, and wherein the multi-layer stack comprises a silicon layer disposed on a silicon germanium layer, the silicon germanium layer being disposed between the silicon layer and the substrate; and
a second component disposed in the substrate, wherein the second component does not include a high-k dielectric.

6. The semiconductor device of claim 5, wherein the first component is a transistor having a source region and a drain region, the source region and the drain region each having an upper boundary that extends above the high-k gate dielectric.

7. The semiconductor device of claim 5, wherein the second component comprises a gate structure comprising a silicon dioxide gate dielectric.

8. The semiconductor device of claim 5, further comprising a metal gate electrode disposed over the high-k gate dielectric.

9. A semiconductor device, comprising:
a core transistor disposed in a substrate and having a high-k gate dielectric, a gate electrode, first and second source/drain regions, and a channel, wherein the channel of the core transistor comprises a multi-layer stack filling a first recess in the substrate, the first recess disposed between the first and the second source/drain regions, wherein the multi-layer stack comprises an epitaxial silicon layer disposed on a silicon germanium layer opposite the substrate, the silicon germanium layer being disposed on the substrate, wherein the first and the second source/drain regions comprise an epitaxial layer disposed in a second recess of the substrate, wherein at least a portion of a top surface of the first and the second source/drain regions is above a top surface of the channel of the core transistor; and
an I/O (input/output) transistor disposed in the substrate and having a gate dielectric, a gate electrode, source/drain regions, and a channel, wherein the gate dielectric of the I/O device does not include a high-k dielectric material.

10. The device of claim 9, wherein the epitaxial layer comprises an epitaxial silicon germanium layer.

11. The device of claim 9, wherein a top portion of the first and second source/drain regions comprises an epitaxial silicon carbon layer disposed on the epitaxial layer.

12. The device of claim 9, further comprising spacers disposed on the first and second source/drain regions, the spacers disposed above a portion of the epitaxial layer.

13. The device of claim 9, wherein the channel of the I/O transistor does not comprise any multi-layer stack.

14. The device of claim 9, wherein the source/drain regions of the I/O transistor do not comprise any epitaxial layer.

* * * * *